United States Patent
Yu et al.

(10) Patent No.: US 7,651,943 B2
(45) Date of Patent: Jan. 26, 2010

(54) FORMING DIFFUSION BARRIERS BY ANNEALING COPPER ALLOY LAYERS

(75) Inventors: Chen-Hua Yu, Hsin-Chu (TW); Ming Han Lee, Taipei (TW); Ming-Shih Yeh, Chupei (TW)

(73) Assignee: Taiwan Semicondcutor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/032,968

(22) Filed: Feb. 18, 2008

(65) Prior Publication Data

US 2009/0209099 A1 Aug. 20, 2009

(51) Int. Cl.
*H01L 21/44* (2006.01)
(52) U.S. Cl. .................. 438/653; 438/658; 438/660; 257/E21.582; 257/E21.591; 257/E21.477
(58) Field of Classification Search ................. 438/653, 438/658, 660, 667; 257/E21.582, E21.584, 257/E21.591, E21.585, E21.477, E21.479, 257/E21.48, E21.496
See application file for complete search history.

(56) References Cited

U.S. PATENT DOCUMENTS

| 6,387,805 | B2 * | 5/2002 | Ding et al. ................. 438/687 |
| 6,607,982 | B1 * | 8/2003 | Powell et al. ............... 438/687 |
| 7,101,790 | B2 * | 9/2006 | Lee et al. .................... 438/654 |
| 7,119,018 | B2 * | 10/2006 | Lane et al. ................... 438/686 |
| 2002/0006468 | A1 * | 1/2002 | Paranjpe et al. ............... 427/96 |
| 2007/0059502 | A1 * | 3/2007 | Wang et al. ................. 428/209 |
| 2009/0117731 | A1 * | 5/2009 | Yu et al. ..................... 438/627 |

* cited by examiner

*Primary Examiner*—Caridad M Everhart
(74) *Attorney, Agent, or Firm*—Slater & Matsil, L.L.P.

(57) ABSTRACT

A method of forming an interconnect structure of an integrated circuit includes providing a semiconductor substrate; forming a dielectric layer over the semiconductor substrate; forming an opening in the dielectric layer; and forming a copper alloy seed layer in the opening. The copper alloy seed layer physically contacts the dielectric layer. The copper alloy seed layer includes copper and an alloying material. The method further includes filling a metallic material in the opening and over the copper alloy seed layer; performing a planarization to remove excess metallic material over the dielectric layer; and performing a thermal anneal to cause the alloying material in the copper alloy seed layer to be segregated from copper.

19 Claims, 8 Drawing Sheets

FORMING DIFFUSION BARRIERS BY ANNEALING COPPER ALLOY LAYERS

TECHNICAL FIELD

This invention is related generally to integrated circuits, and more particularly to structures and formation methods of interconnect structures, and even more particularly to the formation of diffusion barrier layers of the interconnect structures.

BACKGROUND

A commonly used method for forming metal lines and vias is known as "damascene." Generally, this method involves forming an opening in a dielectric layer, which separates the vertically spaced metallization layers. The opening is typically formed using conventional lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

Copper is typically used for the damascene processes. Copper has a low resistivity, thus the RC delay caused by the resistance in the interconnect structure is low. However, with the down-scaling of the integrated circuits, the dimensions of copper interconnects are also down-scaled. When the dimensions of the copper interconnects approach the mean free path of electrons, the resistivity of the interconnect structure significantly increases. As a result, the RC delays caused by the interconnect structure significantly increase.

Various methods have been explored to reduce the resistivities of the interconnect structures. For example, diffusion barrier layers, which are used to prevent copper from diffusing into neighboring low-k dielectric layers, typically have high resistivities. Methods for forming thinner diffusion barrier layers are thus explored. However, in conventional diffusion barrier formation methods, the diffusion barrier layers exist at the via bottoms, causing the increase in the resistances of the interconnect structures. An additional problem is that with the increasing down-scaling of integrated circuits, the thickness of diffusion barrier layers becomes significant compared to the widths of the respective metal lines and vias. As a result, the formation of diffusion barrier layers and seed layers becomes increasingly difficult. Accordingly, new methods are needed to solve the above-discussed problems.

SUMMARY OF THE INVENTION

In accordance with one aspect of the present invention, a method of forming an interconnect structure of an integrated circuit includes providing a semiconductor substrate; forming a dielectric layer over the semiconductor substrate; forming an opening in the dielectric layer; and forming a copper alloy seed layer in the opening. The copper alloy seed layer physically contacts the dielectric layer. The copper alloy seed layer includes copper and an alloying material. The method further includes filling a metallic material in the opening and over the copper alloy seed layer; performing a planarization to remove excess metallic material over the dielectric layer; and performing a thermal anneal to cause the alloying material in the copper alloy seed layer to be segregated from copper.

In accordance with another aspect of the present invention, a method of forming an interconnect structure of an integrated circuit includes providing a semiconductor substrate; forming a dielectric layer over the semiconductor substrate; forming an opening in the dielectric layer; forming an alloy seed layer in the opening, wherein the alloy seed layer includes an alloying metal capable of being segregated to surfaces of the alloy seed layer under a thermal budget; filling a metallic material in the opening and over the alloy seed layer; performing a planarization to remove excess metallic material over the dielectric layer; and performing a thermal anneal to cause a segregation of the alloying metal from the alloy seed layer to a bottom surface of the alloy seed layer and a top surface of the metallic material. The thermal anneal is performed after the step of filling the metallic material and before the step of performing the planarization.

In accordance with yet another aspect of the present invention, a method of forming an interconnect structure of an integrated circuit includes providing a semiconductor substrate; forming a low-k dielectric layer over the semiconductor substrate, wherein the low-k dielectric layer includes oxygen and silicon; forming an opening in the low-k dielectric layer; forming a copper alloy seed layer in the opening, wherein the copper alloy seed layer includes an alloying metal capable of being segregated to surfaces of the copper alloy seed layer under a thermal budget; plating copper (plated copper) in the opening and over the copper alloy seed layer; after the step of plating copper, performing a thermal anneal to cause the alloying metal to diffuse to a bottom surface of the copper alloy seed layer and to a top surface of the plated copper; and after the thermal anneal, performing a chemical mechanical polish to remove excess copper over the low-k dielectric layer, wherein the alloying metal concentrated in a top surface of the plated copper is removed.

In accordance with yet another aspect of the present invention, an integrated circuit includes a semiconductor substrate; a dielectric layer over the semiconductor substrate; an opening in the dielectric layer; and a diffusion barrier layer in the opening and in contact with the dielectric layer. The diffusion barrier layer includes a material selected from the group consisting essentially of metal oxide of a metal, metal silicon oxide of the metal, and combinations thereof. The metal is capable of being segregated from copper under a thermal budget. The interconnect structure further includes a metallic material in the opening and over the diffusion barrier layer. The metallic material is different from the diffusion barrier layer. The metallic material has a top surface substantially leveled to a top surface of the dielectric layer.

In accordance with yet another aspect of the present invention, an integrated circuit includes a semiconductor substrate; a low-k dielectric layer over the semiconductor substrate, wherein the low-k dielectric layer comprises oxygen and silicon; an opening in the low-k dielectric layer, wherein the opening includes a via opening and a trench opening over and joining the via opening; and a diffusion barrier layer in the opening and in contact with the dielectric layer. The diffusion barrier layer includes a material selected from the group consisting essentially of a metal oxide of a metal, a metal silicon oxide of the metal, and combinations thereof. The metal is capable of being segregated from copper under a thermal budget. The diffusion barrier layer includes a portion at the bottom of the trench opening, while the diffusion barrier layer is free from the bottom of the via opening. The integrated circuit further includes a copper feature in the opening and over the diffusion barrier layer, wherein the copper feature has a top surface substantially leveled to a top surface of the low-k dielectric layer.

The advantageous features of the present invention includes improved reduced thickness of diffusion barrier layer, and increase gap-filling into trench openings and via openings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming barrier layers of interconnect structures is provided. The intermediate stages for manufacturing the preferred embodiment of the present invention are illustrated. Variations of the preferred embodiment are then discussed. Throughout the various views and illustrative embodiments of the present invention, like reference numbers are used to designate like elements.

Figure 1:
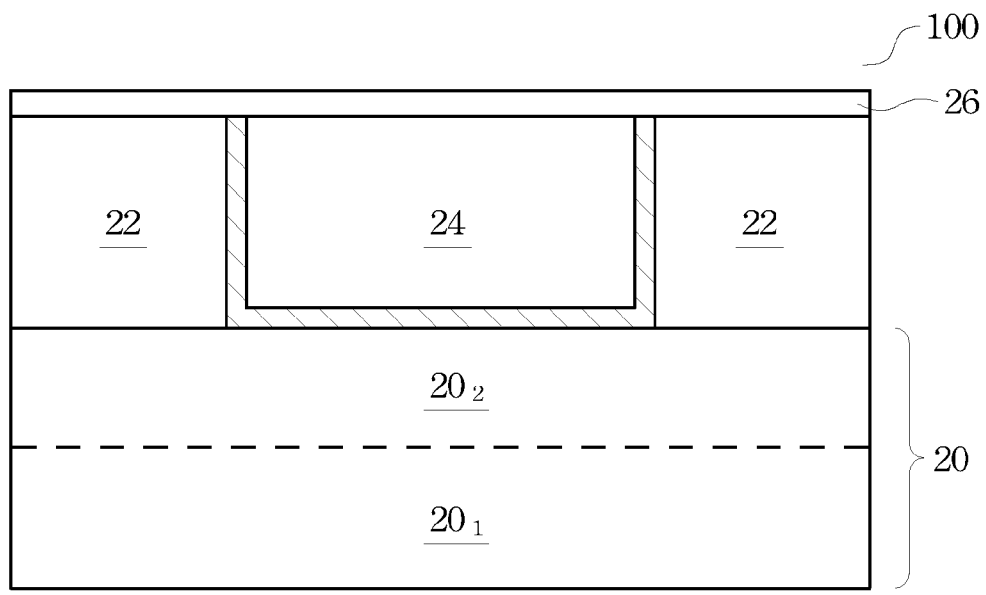
FIGS. 1 through 8 are cross-sectional views of intermediate stages in the manufacturing of an interconnect structure embodiment, wherein a dual damascene process is illustrated.

FIG. 1 illustrates wafer 100, which includes dielectric layer 22 over a schematically illustrated base structure 20. Base structure 20 may include a semiconductor substrate, referred to herein as $20_1$, and overlying layers $20_2$, which may include a contact etch stop layer (CESL), an inter-layer dielectric (ILD), and inter-metal dielectrics (IMD, not shown). Semiconductor substrate $20_1$ may be a single crystalline or a compound semiconductor substrate. Active and passive devices (not shown), such as transistors, capacitors, resistors, and the like, may be formed on semiconductor substrate $20_1$.

FIG. 1 also illustrates conductive line 24 formed in dielectric layer 22, which is formed over base structure 20. Conductive line 24 is preferably a metal line including copper, tungsten, aluminum, silver, gold, alloys thereof, compounds thereof, and combinations thereof. Conductive line 24 is typically connected to another underlying feature (not shown), such as a via or a contact plug. Dielectric layer 22 may be an inter-metal dielectric (IMD) layer, and preferably has a low k value.

Etch stop layer (ESL) 26 is formed on dielectric layer 22 and conductive line 24. Preferably, ESL 26 includes nitrides, silicon-carbon based materials, carbon-doped oxides, or the like. An exemplary formation method is plasma enhanced chemical vapor deposition (PECVD). However, other commonly used methods such as high-density plasma CVD (HDPCVD), atomic layer CVD (ALCVD), and the like can also be used. For simplicity, base structure 20 is not shown in subsequent drawings.

Figure 2:
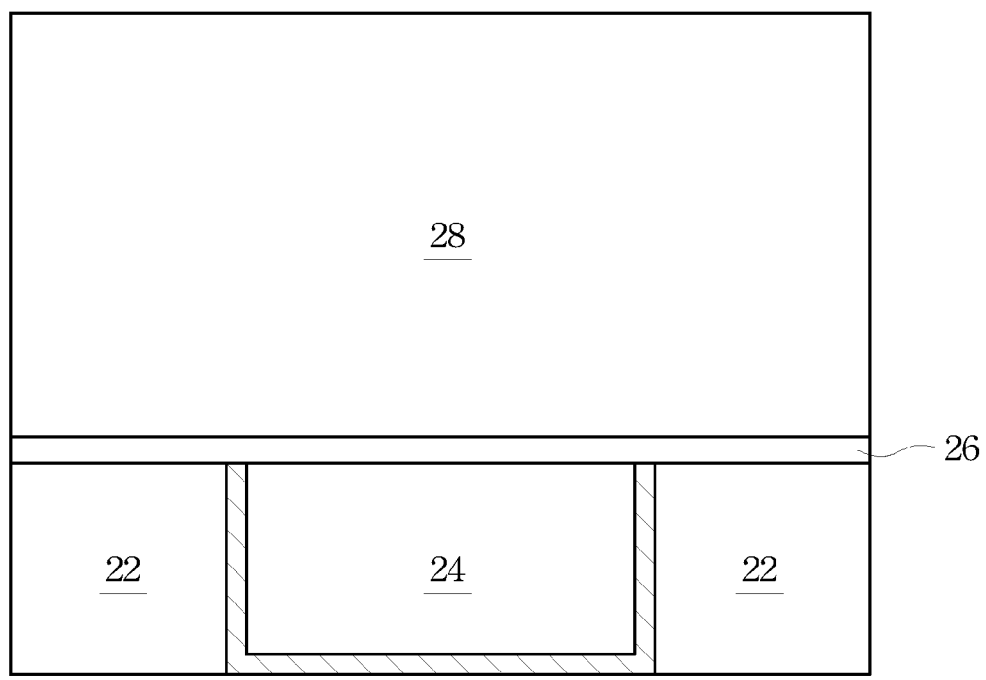

FIG. 2 illustrates the formation of dielectric layer 28, which provides insulation between conductive line 24 and the overlying conductive lines that will be formed subsequently. Accordingly, dielectric layer 28 is sometimes referred to as an inter-metal dielectric (IMD) layer. Preferably, dielectric layer 28 has a dielectric constant (k value) of lower than about 3.5, hence is referred to as low-k dielectric layer 28 throughout the description, although it may also have a greater k value. More preferably, low-k dielectric layer 28 has a k value of less than about 2.8. In the preferred embodiment, low-k dielectric layer 28 includes oxygen, silicon, nitrogen, and the like. The exemplary materials include carbon-containing materials, organo-silicate glass, porogen-containing materials, and the like. A porous structure may exist in low-k dielectric layer 28 for lowering its k value. Low-k dielectric layer 28 may be deposited using a CVD method, preferably PECVD, although other commonly used deposition methods, such as low pressure CVD (LPCVD), ALCVD, and spin-on, can also be used.

Figure 3:
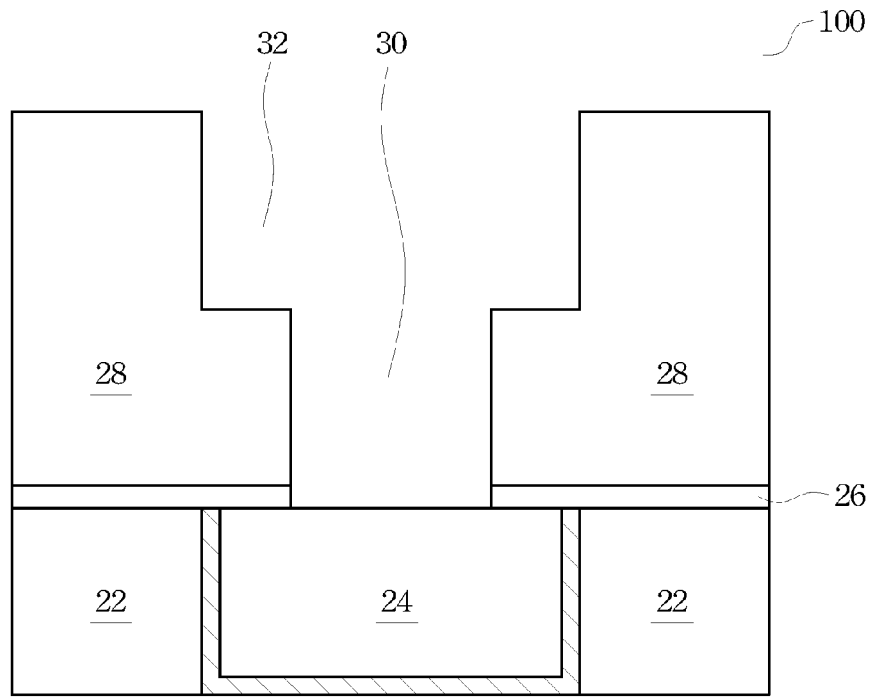

FIG. 3 illustrates the formation of via opening 30 and trench opening 32 in low-k dielectric layer 28. Photo resists (not shown) are formed and patterned over low-k dielectric layer 28 to aid the formation of via opening 30 and trench opening 32. In the preferred embodiment, an anisotropic etch cuts through low-k dielectric layer 28 and stops at ESL 26, thereby forming via opening 30. Trench opening 32 is then formed. Since there is no etch stop layer for stopping the etching of trench opening 32, the etching time is controlled so that the etching of the trench opening 32 stops at a desirable depth. In alternative embodiments, a trench-first approach is taken, in which trench opening 32 is formed prior to the formation of via opening 30. ESL 26 is then etched through via opening 30, exposing underlying conductive line 24.

In alternative embodiments, low-k dielectric layer 28 may be replaced by a first low-k dielectric layer, an ESL on the first low-k dielectric layer, and a second low-k dielectric layer on the ESL. The ESL is used for forming trench opening 32. One skilled in the art will realize the appropriate process steps.

Figure 4:
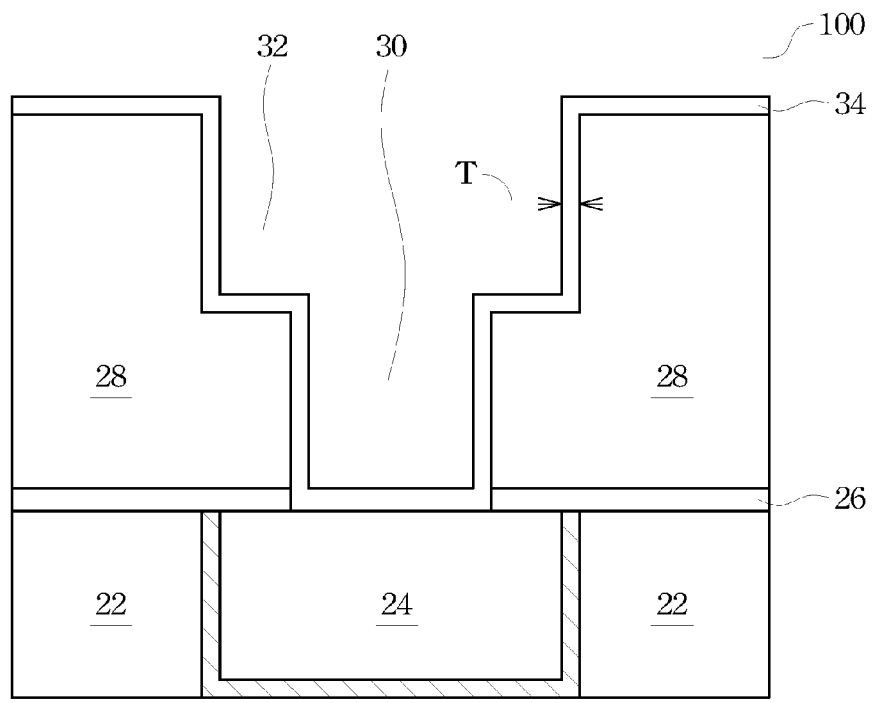

FIG. 4 illustrates the formation of copper alloy seed layer 34. Copper alloy seed layer 34 includes a base metallic material alloyed with an alloying material(s). The base material is preferably copper (and hence the corresponding alloy layer is referred to as a copper alloy layer), although it may also be ruthenium, or other applicable alternatives. In an exemplary embodiment, copper alloy seed layer 34 has an alloy atomic percentage of less than about 60 percent, and preferably between about 0.1 and 10 percent. The alloying materials, which are preferably metals, are selected based on their solubility with the base metallic material, wherein a great solubility is preferred. Further, the alloying materials need to be able to segregate from the base material when under a thermal anneal. After the segregation, the alloying materials diffuse to the surfaces of the base metallic material. Based on these preferences, the alloying materials in copper alloy seed layer 34 may be selected from manganese (Mn), aluminum (Al), silver (Ag), chromium (Cr), niobium (Nb), magnesium (Mg), indium (In), titanium (Ti), Tin (Sn), and combinations thereof. Typically, if the amount of the alloying materials in copper seed layer 34 exceeds a maximum atomic percentage, the base metallic material will instead diffuse to the surfaces of the alloying materials. The maximum atomic percentage varies if different alloying materials are used. In an exemplary embodiment in which Mn is used as an alloying material, the maximum atomic percentage is about 52 atomic percent. Accordingly, the atomic percentage of the alloying materials in copper seed layer 34 should be lower than the respective maximum atomic percentage, so that when the thermal anneal is performed, the alloying materials diffuse to the surfaces of the base metallic materials, not the other way around. The thickness T of copper alloy seed layer 34 is preferably between about 30 Å and about 900 Å, although greater or smaller thicknesses may also be used. It is noted that the increase in the atomic percentage of alloying materials in copper alloy seed layer 34 causes the improvement in the reliability of the resulting interconnect structure. However, excess alloying materials also adversely cause the increase in the resistivity of the interconnect structure. The determination of the optimal percentage of the alloying material thus needs to take both the reliability and the resistivity into account.

Preferably, copper alloy seed layer 34 is formed using physical vapor deposition (PVD), which may include DC sputter, RF sputter, bias sputter, magnetron sputter, or the like. The respective target(s) will then include the desirable base material such as copper or ruthenium, and the alloying materials. Alternatively, copper alloy seed layer 34 may be formed using one of the chemical vapor deposition (CVD) methods, or formed using electroless plating, in which case, the plating solution includes both the ions of the base metallic material and the ions of the alloying materials.

Figure 5:
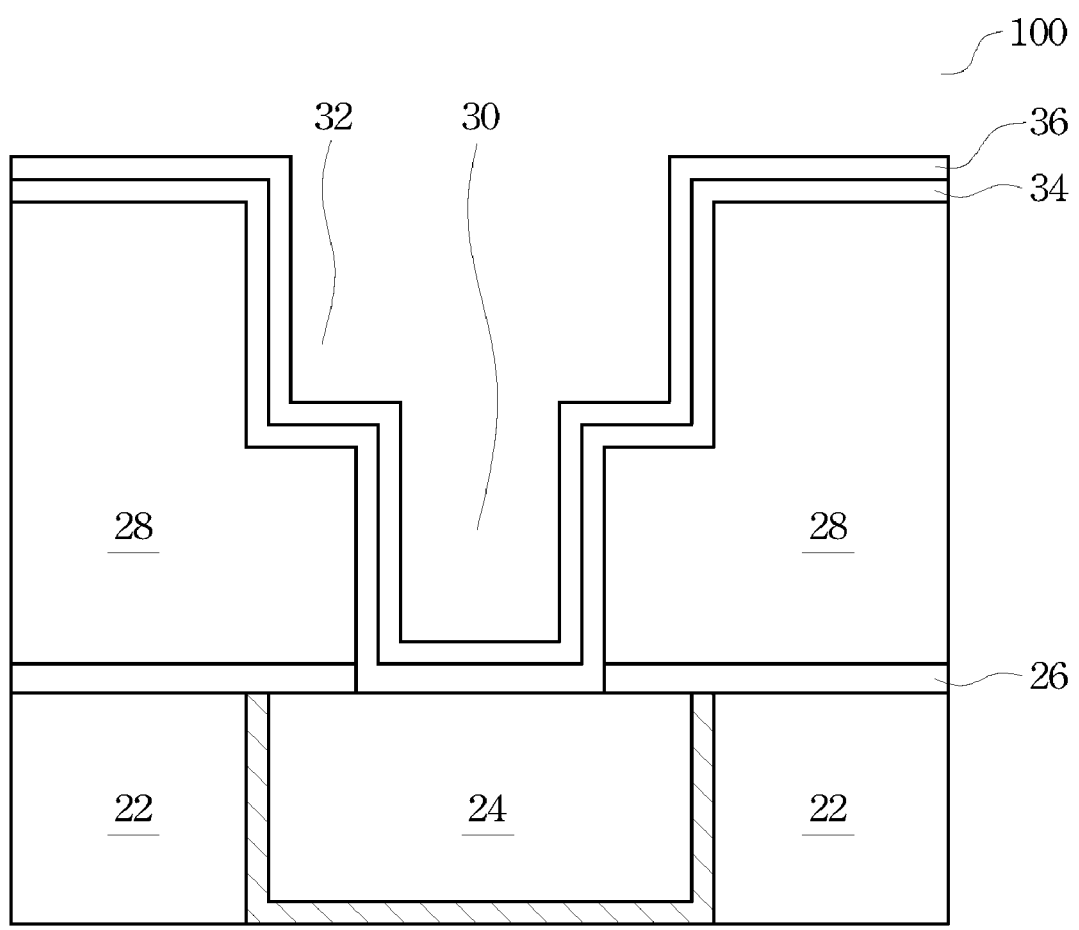

Optionally, as shown in FIG. 5, copper seed layer 36 is formed. Copper seed layer 36 preferably includes (substantially) pure copper (for example, with the impurity percentage of less than about 0.1 atomic percent). Advantageously, substantially pure copper seed layer 36 has a low resistivity, and hence improves the subsequent copper plating process. The formation methods of copper seed layer 36 may essentially be the same as for forming copper alloy seed layer 34.

Figure 6:
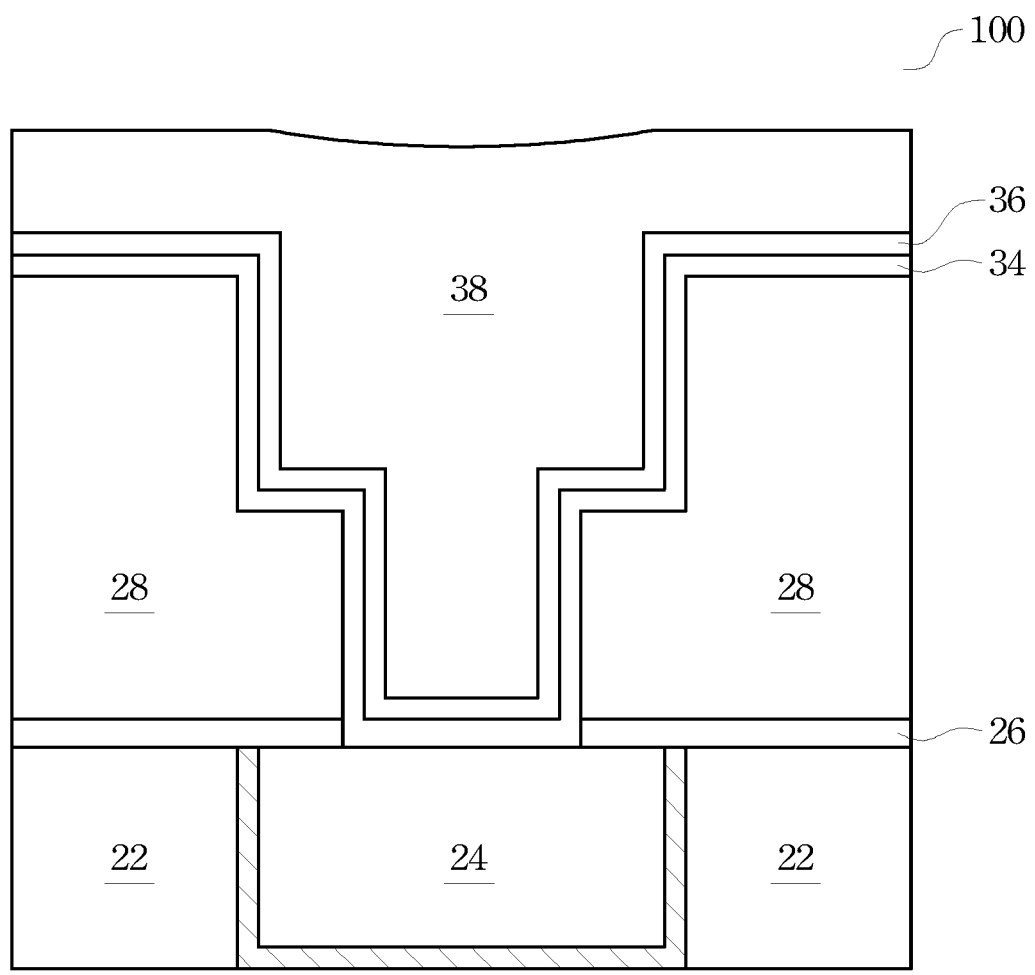

Next, as shown in FIG. 6, copper 38 is filled into opening 32. In the preferred embodiment, copper 38 is formed using electro plating, wherein wafer 100 is submerged into a plating solution containing ionized copper. In the resulting structure, the top surface of copper 38 is higher than the top surface of low-k dielectric layer 28.

Figure 7:
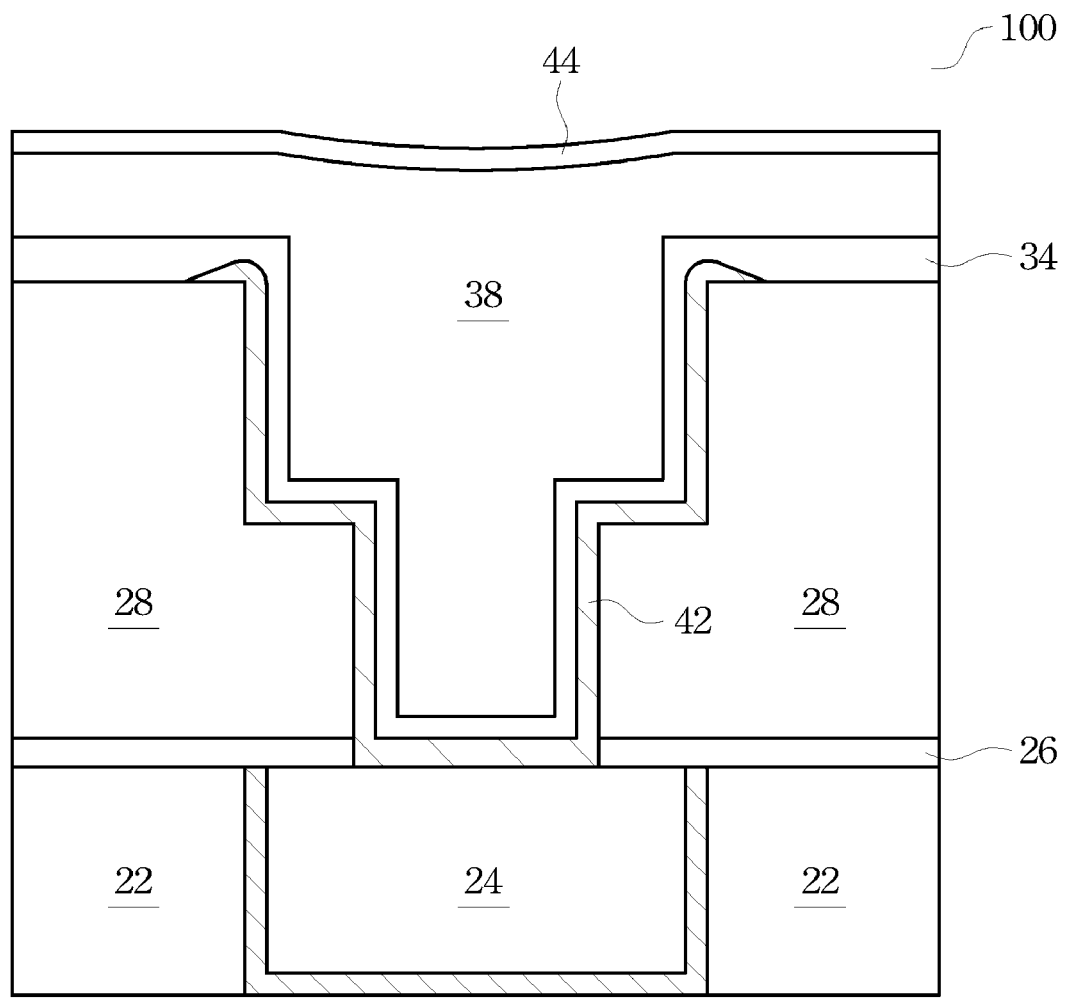

Referring to FIG. 7, wafer 100 is thermally annealed. The thermal anneal causes the alloying materials in copper alloy seed layer 34 to be segregated from copper. The alloying materials diffuse to the free surface of copper 38, and to the interface between copper alloy seed layer 34 and low-k dielectric layer 28, and are concentrated in these regions. The regions with concentrated alloying materials are schematically illustrated as layers 42 and 44. Meanwhile, with the alloying materials in copper alloy seed layer 34 diffused away, the remaining copper alloy seed layer 34 may have substantially pure copper (or ruthenium) left. Also, the alloying materials penetrate through copper 38 to concentrate in layer 44, and hence the bulk of copper 38 is also substantially free from the alloying materials. In an exemplary embodiment, the substantially pure copper alloy seed layer 34 and copper 38 have an impurity percentage of less than about 0.1 percent. Although copper alloy seed layer 34 is still shown in FIG. 7, it is realized that it may not be distinguishable from copper 38 if both are formed of similar materials such as copper. Seed layer 36 is not shown in subsequent drawings since it may have merged with copper 38.

Also, with the energy provided by the thermal anneal, the alloying materials in layer 42 will react (forming bonds) with low-k dielectric layer 28, turning layer 42 into a diffusion barrier layer. In an exemplary embodiment wherein low-k dielectric layer 28 comprises oxygen, diffusion barrier layer 42 includes metal oxides (for example, $MeO_x$, wherein the alloying materials are represented by "Me"). In another exemplary embodiment wherein low-k dielectric layer 28 includes oxygen and silicon, diffusion barrier layer 42 includes metal silicon oxides ($MeSi_yO_z$), metal oxides, or the combinations thereof. Diffusion barrier layer 42 may have a thickness of less than about 30 Å, preferably between about 10 Å and about 20 Å, although it may be thicker or thinner, depending on the amount of the alloying materials in copper alloy seed layer 34.

To segregate the alloying materials from copper, the thermal anneal needs to be performed at a temperature higher than a segregation activating temperature, under which the segregation is substantially negligible, if at all. The segregation activating temperature may vary if different alloying materials are used. The segregation effect is affected by both the temperature and the duration of the thermal anneal. One skilled in the art will be able to find the optimum temperature and duration through experiments. In an exemplary embodiment wherein the alloying materials include Mn, the thermal anneal may be performed at about 300° C. and about 400° C. for about 60 to about 120 minutes.

Figure 8:
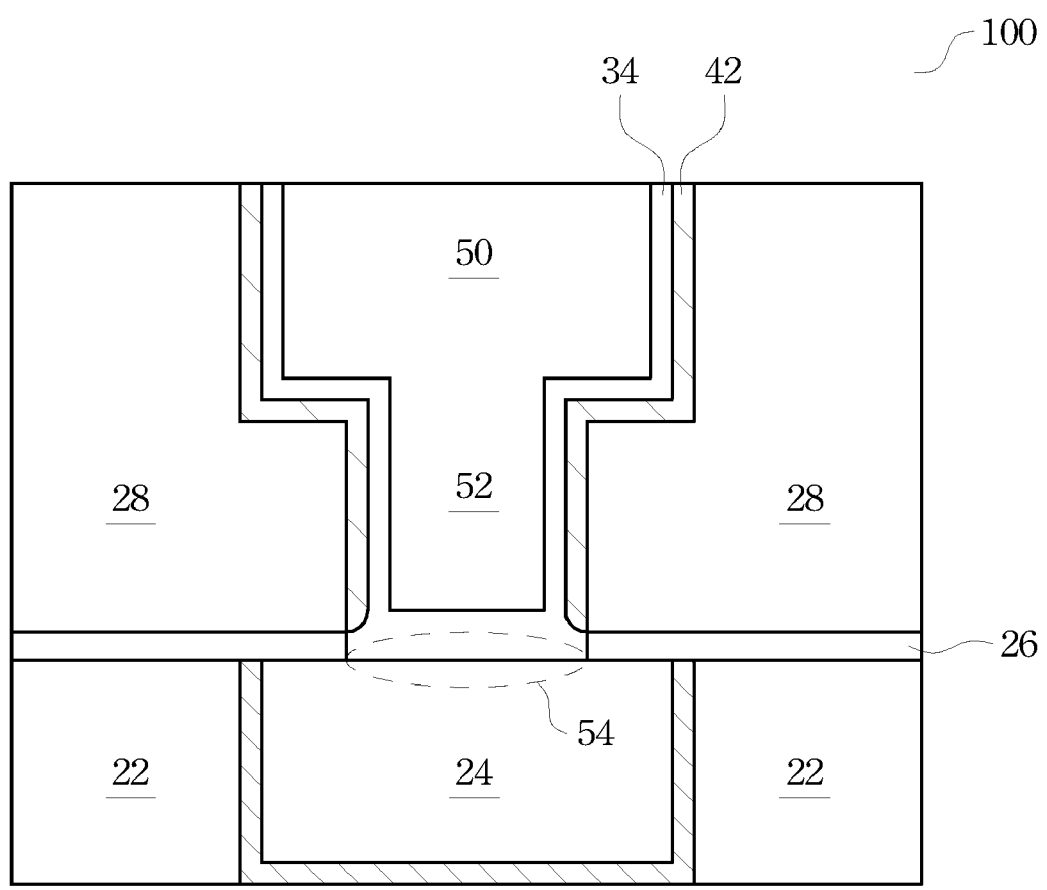

Next, as shown in FIG. 8, a chemical mechanical polish (CMP) is performed to remove excess portions of copper 38 and copper alloy seed layer 34 over low-k dielectric layer 28, leaving copper line 50, via 52, and respective underlying portions of barrier layer 42. Layer 44, which includes concentrated alloying materials, is removed by the CMP.

It is appreciated that the thermal anneal may be formed at different times. For example, the thermal anneal may be performed between the steps of forming copper alloy seed layer 34 and forming copper seed layer 36, between the steps of forming copper seed layer 36 and plating copper 38, or after the CMP. It is, however, particularly advantageous to perform the thermal anneal after the step of forming copper 38 and before the step of performing CMP. The reason is that by performing the thermal anneal at this time, the concentrated alloying materials (layer 44) will be removed by the subsequent CMP. Conversely, if the thermal anneal is performed at any other time, the alloying materials concentrated to the free surface will remain in the final structure, and adversely increase the resistivity of the interconnect structure.

An advantageous feature of the present invention is that the formation of the diffusion barrier layer is self-aligned, and there is no diffusion barrier layer formed at the via bottom (the region marked as 54 in FIG. 8). Since diffusion barrier layers typically have higher resistivities than copper, the portion of diffusion barrier layers at the via bottom will adversely increase the resistance of the interconnect structure, and reduce the reliability affected by electro-migration. However, since the alloying materials may penetrate the via bottom substantially freely, there is no concentration of the alloying materials in the via bottom, and hence no diffusion barrier layer is formed in region 54.

Figure 9:
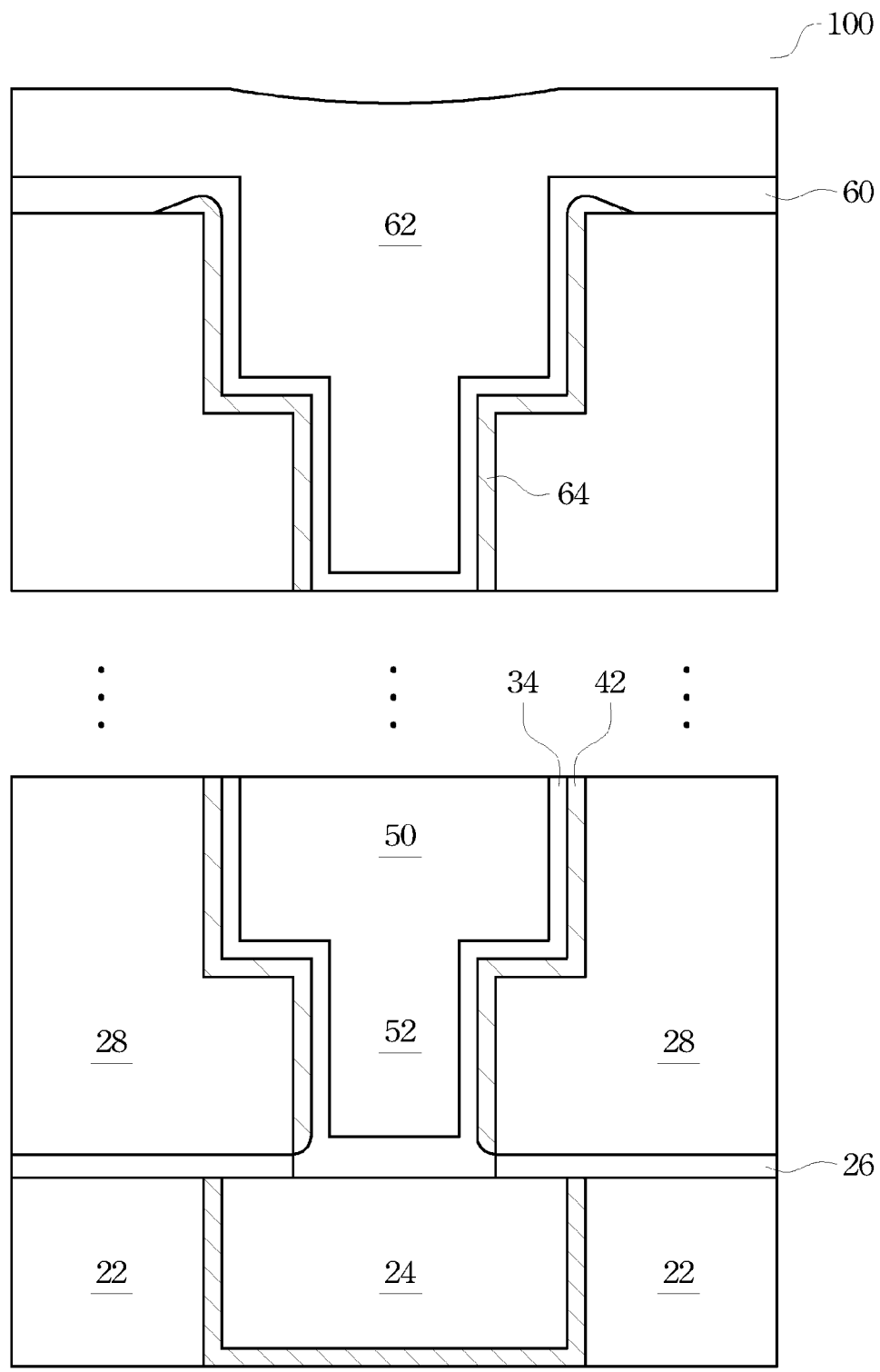
FIG. 9 illustrates an additional metallization layer formed on the interconnect structure shown in FIG. 8.

FIG. 9 illustrates an intermediate structure of an additional metallization layer. Preferably, for each of the metallization layers, the steps shown in FIGS. 3 through 8 are repeated. For example, to form the structure as shown in FIG. 9, copper alloy seed layer 60 is formed, followed by the formation of an optional pure seed layer (not shown) and plated copper 62. Another thermal anneal is then performed after the formation of copper 62 to form diffusion barrier layer 64. Next, a CMP will be performed to remove excess copper 62.

Figure 10:
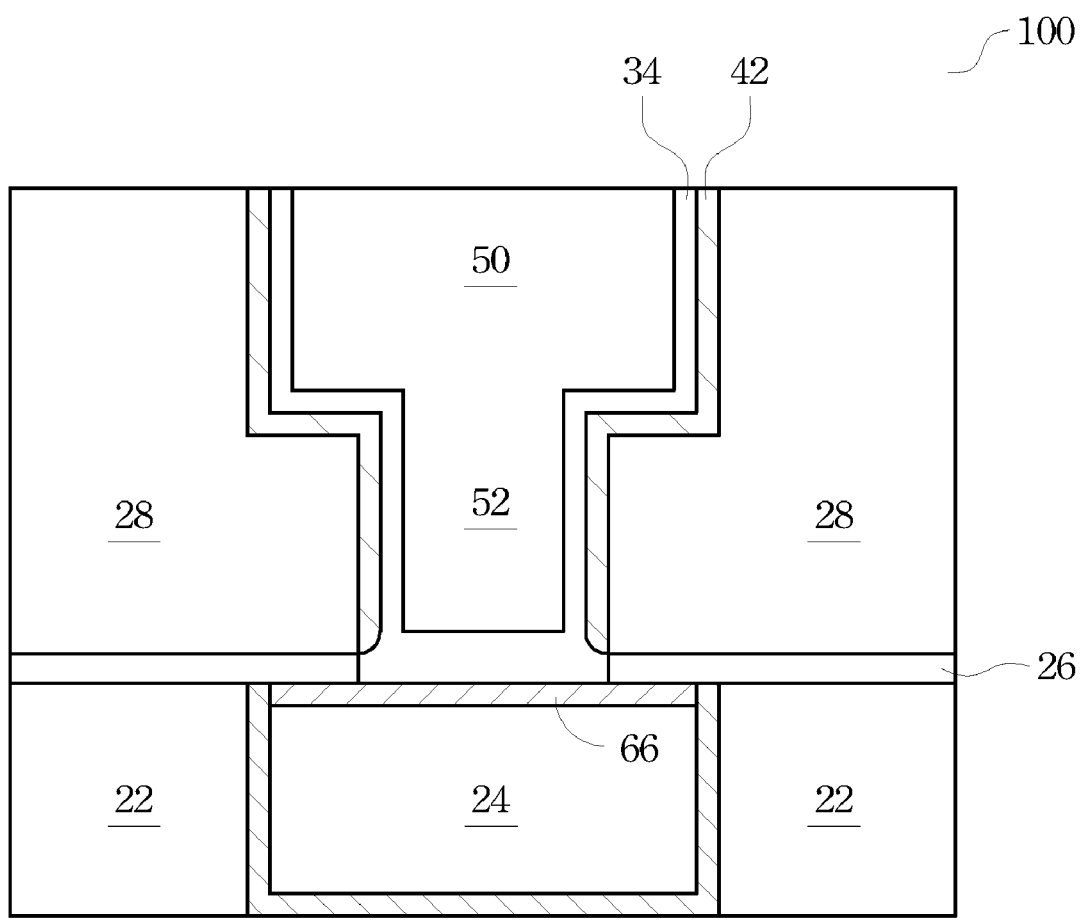
FIG. 10 illustrates an interconnect structure embodiment including a metal cap layer.

The embodiments of the present invention may be combined with other metallization formation schemes. For example, FIG. 10 illustrates an interconnect structure including metal cap 66, which may be formed of cobalt, nickel, tungsten, molybdenum, silicon, zinc, chrome, boron, phosphorus, nitrogen, and combinations thereof. Again, as metal cap 66 includes no oxygen or silicon, no diffusion barrier layer (metal oxides or metal silicon oxides) are formed on metal cap 66.

The embodiments of the present invention have several advantageous features. Compared to the conventional deposition processes of forming diffusion barrier layer and copper seed layer (which are complex due to the conformity requirement), in the embodiments of the present invention, only one copper alloy seed layer is required, the interconnect structure formation process is thus simplified. Further, the copper alloy layer may be as thin as about 30 Å, and hence the aspect ratio of the remaining opening is substantially unaffected. The gap-filling of the plated copper is thus easier. Accordingly, the embodiments of the present invention are well suited for smaller-scale integrated circuits. In addition, since the formation of the diffusion barrier layer is self-aligned, no diffusion barrier layer is formed at via bottoms. This not only results in the decrease in the RC delay of the interconnect structure, but also reduces the likelihood of electro-migration failure. Experiments have revealed that compared to interconnect structures having TaN or Ta diffusion barrier layers, the mean time to failure of the embodiments of the present invention has increased by about 3 to 5 times. Further, resistances of sample via chains formed using methods of the present invention are only about 10 percent of the samples having TaN or Ta diffusion barrier layers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit, the method comprising:
   providing a semiconductor substrate;
   forming a dielectric layer over the semiconductor substrate;
   forming an opening in the dielectric layer;
   forming a copper alloy seed layer in the opening, wherein the copper alloy seed layer physically contacts the dielectric layer, and wherein the copper alloy seed layer comprises copper and an alloying material selected from the group consisting essentially of manganese (Mn), silver (Ag), chromium (Cr), niobium (Nb), indium (In), tin (Sn), and combinations thereof;
   filling a metallic material in the opening and over the copper alloy seed layer;
   performing a planarization to remove excess metallic material over the dielectric layer; and
   performing a thermal anneal to cause the alloying material in the copper alloy seed layer to be segregated from the copper.

2. The method of claim 1, wherein the thermal anneal is performed after the step of filling the metallic material and before the step of the planarization.

3. The method of claim 1, wherein the thermal anneal results in diffusion of the alloying material to a bottom surface of the copper alloy seed layer and to a top surface of the metallic material, and wherein the thermal anneal incurs a reaction between the alloying material and the dielectric layer.

4. The method of claim 1 further comprising forming an additional metallization layer comprising:
   forming an additional dielectric layer over the dielectric layer;
   forming an additional opening in the additional dielectric layer;
   forming an additional copper alloy seed layer in the additional opening, wherein the additional copper alloy seed layer physically contacts the additional dielectric layer, and wherein the additional copper alloy seed layer comprises copper and an additional alloying material;
   filling an additional metallic material in the additional opening and over the additional copper alloy seed layer;
   performing an additional planarization to remove excess additional metallic material over the additional dielectric layer; and
   between the steps of filling the additional metallic material and performing the additional planarization, performing an additional thermal anneal to cause a segregation of the additional alloying material from the copper in the additional copper alloy seed layer.

5. The method of claim 1, wherein the alloying material has a concentration lower than a maximum concentration, and wherein the alloying material diffuses to a top surface and a bottom surface of the copper alloy seed layer.

6. The method of claim 1, wherein, between the step of forming the copper alloy seed layer and the step of filling the metallic material in the opening, no copper seed layer is formed.

7. The method of claim 1 further comprising forming a substantially pure copper layer between the step of forming the copper alloy seed layer and the step of filling the metallic material in the opening.

8. The method of claim 1, wherein the alloying material comprises manganese (Mn).

9. The method of claim 1, wherein the dielectric layer comprises oxygen.

10. The method of claim 9, wherein the dielectric layer further comprises silicon.

11. The method of claim 9, wherein, during the thermal anneal, the alloying material reacts with the oxygen in the dielectric layer.

12. A method of forming an integrated circuit, the method comprising:
   providing a semiconductor substrate;
   forming a dielectric layer over the semiconductor substrate;
   forming an opening in the dielectric layer;
   forming an alloy seed layer in the opening, wherein the alloy seed layer comprises ruthenium as a base material and an alloying metal capable of being segregated to surfaces of the alloy seed layer under a thermal budget;
   filling a metallic material in the opening and over the alloy seed layer;
   performing a planarization to remove excess metallic material over the dielectric layer; and
   after the step of filling the metallic material and before the step of performing the planarization, performing a thermal anneal to cause a segregation of the alloying metal from the alloy seed layer to a bottom surface of the alloy seed layer and to a top surface of the metallic material.

13. The method of claim 12, wherein the alloy seed layer physically contacts the dielectric layer.

14. The method of claim 12, wherein the dielectric layer has a low k value, and comprises oxygen and silicon.

15. The method of claim 12, wherein the alloying metal is selected from the group consisting essentially of manganese (Mn), silver (Ag), chromium (Cr), niobium (Nb), indium (In), tin (Sn), and combinations thereof.

16. The method of claim 12, wherein the thermal anneal incurs a reaction between the alloying metal and the dielectric layer to form a diffusion barrier layer.

17. The method of claim 12, wherein the alloying material comprises a material selected from the group consisting essentially of silver (Ag), chromium (Cr), niobium (Nb), indium (In), tin (Sn), and combinations thereof.

18. The method of claim 12, wherein the alloying material comprises manganese (Mn).

19. The method of claim 12, wherein the step of performing the planarization is performed after the step of performing the thermal anneal.

* * * * *